United States Patent
Pang et al.

(10) Patent No.: US 8,957,516 B2
(45) Date of Patent: Feb. 17, 2015

(54) LOW COST AND HIGH PERFORMANCE FLIP CHIP PACKAGE

(71) Applicant: Broadcom Corporation, Irvine, CA (US)

(72) Inventors: Mengzhi Pang, Cupertino, CA (US); Ken Zhonghua Wu, Fremont, CA (US); Matthew Kaufmann, Morgan Hill, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/247,222

(22) Filed: Apr. 7, 2014

(65) Prior Publication Data

US 2014/0217573 A1    Aug. 7, 2014

Related U.S. Application Data

(63) Continuation of application No. 13/357,078, filed on Jan. 24, 2012, now abandoned.

(51) Int. Cl.
*H01L 23/34*       (2006.01)
*H01L 21/78*       (2006.01)
(Continued)

(52) U.S. Cl.
CPC ........... *H01L 23/34* (2013.01); *H01L 21/78* (2013.01); *H01L 24/19* (2013.01); *H01L 24/20* (2013.01); *H01L 23/3675* (2013.01); *H01L 23/5389* (2013.01); *H01L 24/83* (2013.01); *H01L 24/97* (2013.01); *H01L 23/12* (2013.01); *H01L 23/481* (2013.01); *H01L 23/3121* (2013.01); *H01L 2224/04105* (2013.01); *H01L 24/32* (2013.01);
(Continued)

(58) Field of Classification Search
CPC ............. H01L 2924/00; H01L 2924/00014; H01L 2224/16225; H01L 2924/15311; H01L 2924/15153; H01L 2224/73253; H01L 2924/01079; H01L 2924/01033; H01L 2924/01078; H01L 23/3128
USPC .......................................... 438/122
See application file for complete search history.

(56) References Cited

U.S. PATENT DOCUMENTS 5,198,963 A    3/1993   Gupta et al.
6,002,168 A   12/1999   Bellaar et al.

(Continued)

FOREIGN PATENT DOCUMENTS

KR   10-2011-0036249 A   4/2011

*Primary Examiner* — David Vu
*Assistant Examiner* — Jonathan Han
(74) *Attorney, Agent, or Firm* — McDermott Will & Emery LLP

(57) ABSTRACT

A low cost and high performance flip chip package is disclosed. By assembling the package using a substrate panel level process, a separate fabrication of a substrate is avoided, thus enabling the use of a coreless substrate. The coreless substrate may include multiple stacked layers of laminate dielectric films having conductive traces and vias. As a result, electrical connection routes may be provided directly from die contact pads to package contact pads without the use of conventional solder bumps, thus accommodating very high density semiconductor dies with small feature sizes. The disclosed flip chip package provides lower cost, higher electrical performance, and improved thermal dissipation compared to conventional fabricated substrates with solder bumped semiconductor dies.

20 Claims, 3 Drawing Sheets

(51) Int. Cl.
  *H01L 23/00* (2006.01)
  *H01L 23/367* (2006.01)
  *H01L 23/538* (2006.01)
  *H01L 23/12* (2006.01)
  *H01L 23/48* (2006.01)
  *H01L 23/31* (2006.01)

(52) U.S. Cl.
  CPC .............. *H01L 24/73* (2013.01); *H01L 24/92* (2013.01); *H01L 2224/12105* (2013.01); *H01L 2224/32245* (2013.01); *H01L 2224/73267* (2013.01); *H01L 2224/83192* (2013.01); *H01L 2224/92244* (2013.01); *H01L 2224/97* (2013.01); *H01L 2924/15153* (2013.01)
  USPC ........... 257/712; 438/108; 438/109; 438/122; 257/684; 257/685; 257/686; 257/690

(56) References Cited

U.S. PATENT DOCUMENTS

| | | |
|---|---|---|
| 6,188,578 B1 | 2/2001 | Lin et al. |
| 6,461,895 B1 | 10/2002 | Liang et al. |
| 6,709,898 B1 * | 3/2004 | Ma et al. ............. 438/122 |
| 6,743,661 B1 | 6/2004 | Drewery |
| 6,791,195 B2 | 9/2004 | Urushima |
| 7,220,667 B2 | 5/2007 | Yamagata |
| 7,585,702 B1 | 9/2009 | Wang et al. |
| 7,675,163 B2 | 3/2010 | Heydari et al. |
| 7,834,450 B2 | 11/2010 | Kang |
| 7,838,337 B2 | 11/2010 | Marimuthu et al. |
| 7,901,986 B2 | 3/2011 | Arai et al. |
| 8,008,125 B2 * | 8/2011 | McConnelee et al. ....... 438/109 |
| 8,022,555 B2 | 9/2011 | Hwang et al. |
| 8,133,761 B2 | 3/2012 | Gerber et al. |
| 8,202,763 B2 | 6/2012 | Meyer et al. |
| 8,310,063 B2 | 11/2012 | Wang |
| 8,344,516 B2 | 1/2013 | Chainer |
| 8,461,672 B2 | 6/2013 | Haba et al. |
| 2002/0030261 A1 | 3/2002 | Rolda et al. |
| 2003/0036219 A1 | 2/2003 | Masumoto et al. |
| 2003/0197285 A1 * | 10/2003 | Strandberg et al. ........... 257/778 |
| 2005/0218518 A1 | 10/2005 | Jiang et al. |
| 2006/0145328 A1 * | 7/2006 | Hsu ............................. 257/690 |
| 2006/0186531 A1 * | 8/2006 | Hsu ............................. 257/700 |
| 2006/0186536 A1 * | 8/2006 | Hsu ............................. 257/720 |
| 2006/0220262 A1 | 10/2006 | Meyer et al. |
| 2006/0258044 A1 | 11/2006 | Meyer et al. |
| 2007/0132082 A1 | 6/2007 | Tang et al. |
| 2007/0209831 A1 | 9/2007 | Sakamoto et al. |
| 2007/0273049 A1 | 11/2007 | Khan et al. |
| 2007/0290310 A1 * | 12/2007 | Kusano et al. ................ 257/684 |
| 2007/0290376 A1 | 12/2007 | Zhao et al. |
| 2008/0044944 A1 | 2/2008 | Wakisaka et al. |
| 2008/0128882 A1 | 6/2008 | Baek et al. |
| 2008/0143379 A1 | 6/2008 | Norman |
| 2008/0157322 A1 | 7/2008 | Tang et al. |
| 2008/0157328 A1 | 7/2008 | Kawata |
| 2008/0246138 A1 | 10/2008 | Gerber et al. |
| 2008/0268638 A1 | 10/2008 | Dertinger et al. |
| 2009/0053858 A1 | 2/2009 | Ko et al. |
| 2009/0102030 A1 | 4/2009 | Khan et al. |
| 2009/0321932 A1 * | 12/2009 | Gonzalez et al. ............. 257/750 |
| 2010/0019360 A1 | 1/2010 | Khan et al. |
| 2010/0084754 A1 | 4/2010 | Yoo et al. |
| 2010/0133534 A1 | 6/2010 | Do et al. |
| 2010/0301474 A1 | 12/2010 | Yang |
| 2011/0024888 A1 | 2/2011 | Pagaila et al. |
| 2011/0024906 A1 | 2/2011 | Meyer et al. |
| 2011/0241185 A1 | 10/2011 | Koester et al. |
| 2011/0254160 A1 | 10/2011 | Tsai et al. |
| 2011/0272819 A1 | 11/2011 | Park et al. |
| 2011/0278717 A1 * | 11/2011 | Pagaila et al. ................. 257/737 |
| 2011/0278732 A1 | 11/2011 | Yu et al. |
| 2011/0285030 A1 | 11/2011 | Meyer et al. |
| 2012/0009738 A1 | 1/2012 | Crawford et al. |
| 2012/0018899 A1 | 1/2012 | Pagaila et al. |
| 2012/0062439 A1 | 3/2012 | Liao et al. |
| 2012/0139105 A1 | 6/2012 | Lin et al. |
| 2012/0152605 A1 | 6/2012 | Das et al. |
| 2012/0168942 A1 | 7/2012 | Gan et al. |
| 2012/0211885 A1 | 8/2012 | Choi et al. |
| 2012/0223429 A1 | 9/2012 | Khan et al. |
| 2012/0225522 A1 | 9/2012 | Zhao et al. |
| 2012/0228753 A1 | 9/2012 | Ko et al. |
| 2012/0241921 A1 | 9/2012 | Lee et al. |
| 2012/0313240 A1 | 12/2012 | Cheng et al. |
| 2012/0319293 A1 | 12/2012 | Cheah et al. |
| 2013/0000968 A1 | 1/2013 | Zhao et al. |
| 2013/0062764 A1 | 3/2013 | Jin |
| 2013/0075917 A1 | 3/2013 | Law et al. |
| 2013/0113098 A1 | 5/2013 | Hwang et al. |
| 2013/0147023 A1 | 6/2013 | Lin et al. |

* cited by examiner

LOW COST AND HIGH PERFORMANCE FLIP CHIP PACKAGE

This application is a continuation of U.S. patent application Ser. No. 13/357,078, entitled "Low Cost and High Performance Flip Chip Package," filed on Jan. 24, 2012, which is expressly incorporated by reference herein.

BACKGROUND

To interface bare semiconductor dies to a support surface such as a printed circuit board, there is a need for an appropriate package substrate to interface and route the semiconductor dies within a package, such as a ball grid array (BGA) package, chip scale package (CSP), or system-in-package (SiP), to the printed circuit board. A conventional interface substrate may start with a core material with laminate film layers built up on both sides of the core material. A flip-chip die may then be coupled to the interface substrate using solder bumps.

Demand for higher performance, power efficiency, and reduced form factor have driven successive generations of die shrinks, resulting in flip-chip dies with very high density interconnect features. As the solder bump interconnects are also required to become increasingly dense, the manufacturability, cost, and reliability requirements for interface substrates have gradually become more difficult to meet. Moreover, with shrinking die sizes, effective thermal dissipation from the smaller available die surface area has also become a greater concern.

SUMMARY

The present disclosure is directed to low cost and high performance flip chip packages, substantially as shown in and/or described in connection with at least one of the figures, and as set forth more completely in the claims.

DETAILED DESCRIPTION

Figure 1:
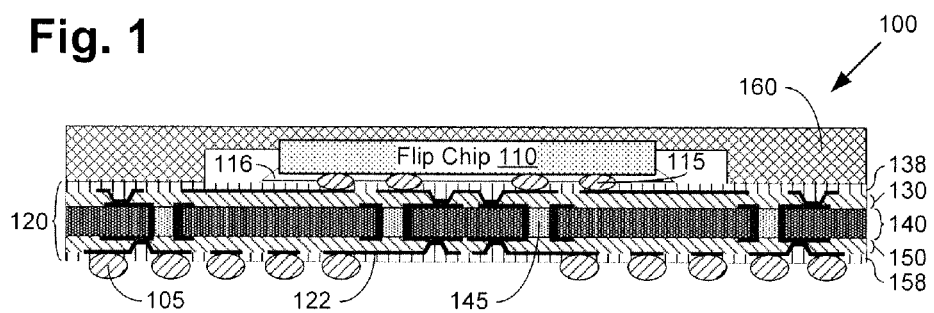
FIG. 1 presents a cross-sectional view of an exemplary flip-chip package using a conventional interface substrate.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view of an exemplary flip-chip package using a conventional interface substrate. FIG. 1 includes package 100 (or "semiconductor package" 100), which includes flip chip 110 mounted on substrate 120 through a plurality of solder bumps, with an exemplary solder bump 115 as shown. Underfill 116 is also placed below flip chip 110 to support and insulate the plurality of solder humps 115. Substrate 120 includes a central core 140 having a plurality of vias, with an exemplary via 145 as shown. Central core 140 may have a thickness of 800 microns or more. An upper thin film 130 and a passivation layer 138 are formed above central core 140. Similarly, a lower thin film 150 and a passivation layer 158 are formed below central core 140. A plurality of conductive traces, with an exemplary conductive trace 122 as shown, is also formed within substrate 120 to route connections between the solder bumps of flip chip 110 and the solder balls of package 100, with an exemplary solder ball 105 as shown. Lid 160 may be adhesively attached to a backside of flip chip 110 and the top of substrate 120 to encapsulate package 100, as shown. Thus, package 100 is ready to be mounted to a support surface, such as a printed circuit board.

As discussed in the background, demand for higher performance, power efficiency, and reduced form factor have driven successive generations of die shrinks for flip chip 110, requiring a correspondingly higher pitch between solder bumps 115. For example, for a flip chip 110 using a 40 nm process, in high volume manufacturing, a 150 micron pitch is standard between solder bumps 115. However, solder bumping is quickly reaching its technological limit as the minimum practical solder bump pitch is considered to be 130 to 150 microns.

Flip chip 110 is manufactured using smaller feature sizes, such as 28 nm and below, solder humping technology is unable to keep pace with the reduced bump pitch demanded of flip chip 110. Thus, a die size of flip chip 110 must increase, resulting in significant cost and form factor increases. Even if the die size of flip chip 110 is successfully reduced, effective thermal dissipation from the smaller die surface area also becomes a greater concern. Moreover, at fine solder bump pitch densities, reliability issues with the solder bump interconnects become increasingly pronounced, with solder joint cracking, electromigration performance degradation, and other issues resulting in lower yields and increased costs.

FIGS. 2A-2G present cross-sectional views of an exemplary flip chip package assembly. Starting with FIG. 2A, FIG. 2A includes panel substrate 270 with heat spreader 280 and backside tape 284. Heat spreader 280 may include electrically conductive materials such as copper or other metals. Backside tape 284 may be applied to heat spreader 280 for mechanical protection and support during assembly, as known in the art. A plurality of recesses in heat spreader 280, with exemplary recess 282 as shown, are provided for receiving dies. While only three recesses are shown in the cross-sectional view of FIG. 2A, it should be understood that panel substrate 270 may accommodate recess grids of any size.

Figure 2A:
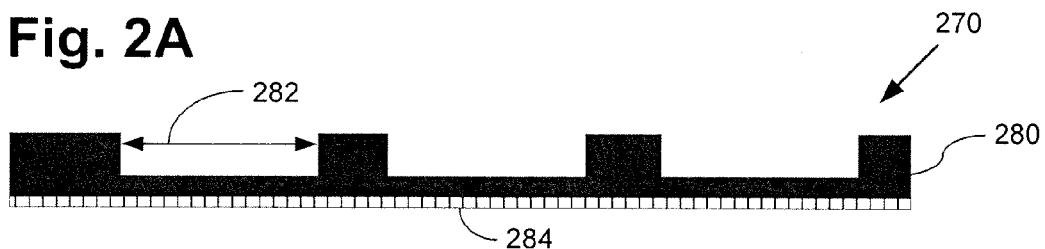
FIGS. 2A, 2B, 2C, 2D, 2E, 2F and 2G present cross-sectional views of an exemplary flip chip package assembly.
Figure 2B:
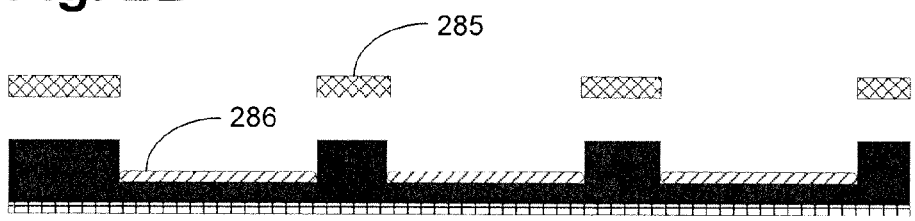

Next, in FIG. 2B, an adhesive thermal interface material (TIM) 286 is printed through mask 285 and into recesses 282 of heat spreader 280. Although adhesive TIM 286 is utilized in FIG. 2B, any die attach material or method of attachment may also be utilized.

Figure 2C:
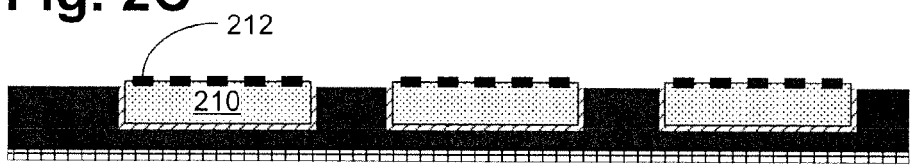

Continuing with FIG. 2C, a semiconductor die may be placed in each of recesses 286 of heat spreader 280, with exemplary semiconductor die 210 as shown. Each semiconductor die 210 includes a plurality of die contact pads, with exemplary die contact pad 212 as shown. Die contact pads 212 may be electrically conductive materials such as copper or other metals. Each semiconductor die 210 may be a flip-chip. After situating the semiconductor dies 210 in respective recesses 286, adhesive TIM 286 may spread to attach each of the semiconductor dies 210 to heat spreader 280, as shown.

Figure 2D:
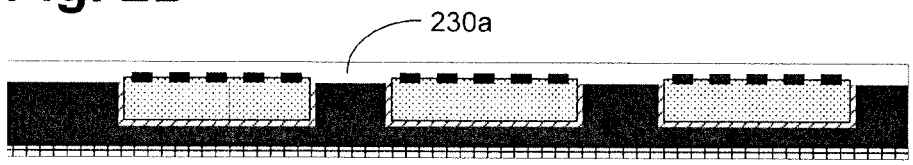

Moving to FIG. 2D, laminate dielectric film 230a may be formed over semiconductor dies 210 and heat spreader 280. Laminate dielectric film 230a may utilize organic materials such as Bismaleimide-Triazine (BT), Ajinomoto Build-up Film (ABF), FR-4 laminates, E679-FBG, ECL4785GS, and E700.

Figure 2E:
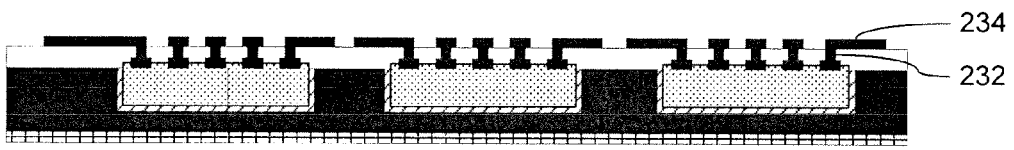

Turning to FIG. 2E, a first level interconnect is created. First, a plurality of vias, with an exemplary via 232 as shown, is formed through laminate dielectric film 230a, for example by laser drilling. Next, the plurality of vias 232 and the top of laminate dielectric film 230a are plated to form a plurality of traces, with an exemplary trace 234 as shown. The plated plurality of vias 232 and the plurality of traces 234 may be electrically conductive materials such as copper or other metals, and may also be the same materials as the plurality of die contact pads 212. As a result, the plurality of vias 232 may be directly connected to a respective plurality of die contact pads 212. Thus, the plurality of semiconductor dies 210 may have no flip chip solder bumps for each respective die contact pad 212. The plurality of vias 232 may eventually connect to a respective plurality of package contact pads, as discussed below.

Figure 2F:
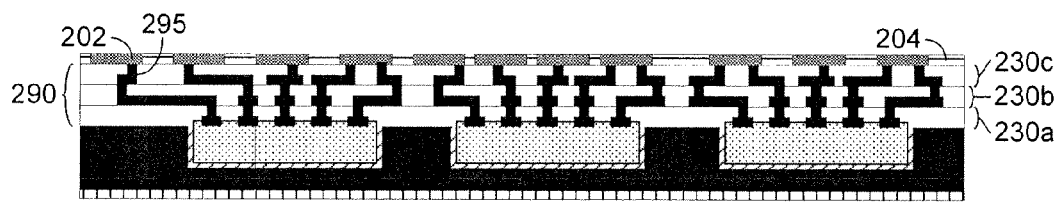

In FIG. 2F, an additional two levels of interconnects are created. However, any number of interconnect levels may be provided by repeating, for as many levels as necessary, the formation of laminate dielectric films, vias, and traces as demonstrated in FIGS. 2D and 2E. As shown in FIG. 2F, laminate dielectric film 230b and laminate dielectric film 230c are formed to create a stack of laminate dielectric films 290. Laminate dielectric films 230a, 230b, and 230c may all utilize the same materials, such as ABF. A plurality of package contact pads 202, with an exemplary package contact pad 202 as shown, is formed above the stack of laminate dielectric films 290. The plurality of package contact pads 202 may be electrically conductive materials such as copper or other metals, and may be surrounded by a solder resist 204, as shown. The traces and vias within the stack of laminate dielectric films 290 combine to form a plurality of electrical connection routes 295, connecting the plurality of die contact pads 212 to a respective plurality of package contact pads 202. As a result, the plurality of vias 232 in the lower laminate dielectric film 230a is also electrically connected to a respective plurality of package contact pads 202.

Subsequently, in FIG. 2G, panel substrate 270 undergoes singulation to result in packages 200a, 200b, and 200c. The backside tape 284 is also removed after singulating. Thus, a flip chip package is provided where the package substrate 206 tightly integrates the semiconductor die 210 without the use of solder bump interconnects. Solder balls may be coupled to package contact pads 202 to prepare packages 200a, 200b, and 200c for flipping onto a support surface such as a printed circuit board.

Figure 2G:
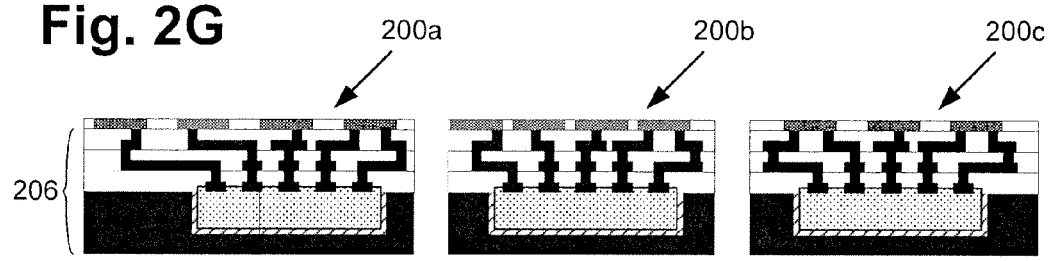

Flip chip package 200a in FIG. 2G provide several advantages compared to the conventional flip chip package 100 in FIG. 1. First, since the process of assembling package 200a does not utilize flip chip solder bumps, such as solder bumps 115, the associated processes of solder bumping, reflowing, defluxing, and adding underfill 116 may be advantageously avoided. Since the pitch between die contact pads 212 is no longer limited by solder bump technology, very high density semiconductor dies 210 may be supported, as the new technological limitation is the alignment of vias 232 to corresponding die contact pads 212. With present laser via drilling processes, a minimum supported pitch between die contact pads 212 can be as low as 15 microns for high volume manufacturing and approximately 12.5 microns for low volume manufacturing, compared to the limit of 130 to 150 microns for solder humping.

Since reflow processes can be avoided entirely and the formation of vias 232 can be carried out at essentially room temperature, coefficient of thermal expansion (CTE) mismatches arising from such reflow processes are also advantageously avoided. Conductivity and electromigration performance is also improved as electrical connection routes 295 may be composed wholly of highly conductive materials such as copper, in comparison to the required solder humps 115 of package 100.

Furthermore, the tight coupling of semiconductor die 210 to package substrate 206 eliminates the need for a separate substrate fabrication process as package 200a is assembled using a substrate panel level process. Thus, central core 140 of substrate 120 may be completely omitted in package substrate 206, resulting in a coreless substrate. Thus, pre-soldering, core materials, and core via drilling and plating steps may be omitted, and layer counts may also be reduced as layers do not need to be built on both sides of a core. By reducing the number of required steps and materials, a very cost effective package assembly may be provided while providing a thinner form factor and higher electrical performance. Moreover, since heat spreader 280 is already an integral part of package 200a and is coupled to semiconductor die 210 via a surrounding adhesive TIM 286, improved thermal dissipation may be provided and package height may be even further reduced as a separate heat sink is not required.

With regards to electrical performance, according to electrical simulations, package 200a may be expected to have an approximately 60% reduction in package resistance and an approximately 70% reduction in inductance when compared to package 100, both considerable improvements. However, since capacitance is largely related to the build-up stack of laminate dielectric films 290, little variance in capacitance is expected between package 100 and package 200a. The removal of the thick central core 140 with its large vias 145 is also expected to provide significant improvements in crosstalk, simultaneous switching output (SSO) noise, and signal path impedance mismatch, which in turn reduces serial interface differential return loss and parallel interface signal reflection. These signal improvements may be especially relevant for high speed, high density memory devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
   a heat spreader having a recess, the recess defined by walls and an inner surface;
   a die disposed within the recess and attached to the walls and the inner surface by a die attachment material, the die having a plurality of die contact pads;
   a first dielectric layer over the heat spreader and the die, the first dielectric layer having a first plurality of vias coupled to the plurality of die contact pads; and
   a plurality of package contact pads coupled to the first plurality of vias such that the plurality of die contact pads are coupled to the plurality of package contact pads, wherein the plurality of package contact pads are disposed within a layer of solder resist over the first dielectric layer such that the plurality of package contact pads do not protrude beyond a top surface of the layer of solder resist, wherein the layer of solder resist and the plurality of package contact pads have a substantially similar thickness.

2. The semiconductor package of claim 1, further comprising a second dielectric layer over the first dielectric layer, the second dielectric layer having a second plurality of vias coupled to the first plurality of vias.

3. The semiconductor package of claim 2, wherein the first plurality of vias are coupled to a first plurality of traces and wherein the second plurality of vias are directly connected to the first plurality of traces.

4. The semiconductor package of claim 3, wherein the second dielectric layer further comprises a second plurality of traces coupled to the second plurality of vias.

5. The semiconductor package of claim 1, wherein the first dielectric layer further comprises a first plurality of traces coupled to the first plurality of vias.

6. The semiconductor package of claim 1, wherein the first plurality of vias are directly connected to the plurality of die contact pads.

7. The semiconductor package of claim 1, wherein the die attachment material is a thermal interface material (TIM).

8. The semiconductor package of claim 1, wherein the die is a flip chip.

9. The semiconductor package of claim 1, wherein the first dielectric layer is an Ajinomoto Build-up film (ABF).

10. A semiconductor package comprising:
a heat spreader having a recess, the recess defined by wall surfaces and a bottom surface;
a die attachment material substantially covering an entirety of the wall surfaces and the bottom inner surface;
a die disposed within the recess and surrounded by the die attachment material such that the die is attached to the heat spreader, the die having a plurality of die contact pads;
a first dielectric layer over the heat spreader and the die, the first dielectric layer having a first plurality of vias coupled to the plurality of die contact pads, and a first plurality of traces coupled to the first plurality of vias; and
a plurality of package contact pads over the first dielectric layer and coupled to the first plurality of traces such that the plurality of die contact pads are coupled to the plurality of package contact pads, wherein the plurality of package contact pads are surrounded by a solder resist.

11. The semiconductor package of claim 10, wherein the plurality of package contact pads do not protrude above a top surface of the solder resist.

12. The semiconductor package of claim 10, further comprising a second dielectric layer over the first dielectric layer and having a second plurality of traces coupled to the first plurality of traces, and a second plurality of vias coupled to the second plurality of traces.

13. The semiconductor package of claim 12, wherein the second plurality of vias are directly connected to the first plurality of traces.

14. The semiconductor package of claim 10, wherein the die attachment material is a thermal interface material (TIM).

15. The semiconductor package of claim 10, wherein the die is a flip chip.

16. A semiconductor package comprising:
a semiconductor die having a plurality of die contact pads;
a heat spreader having a recess, the recess defined by walls and an inner surface, the recess configured to fit the semiconductor die between the walls and over the inner surface;
a thermal interface material (TIM) attaching the semiconductor die to the walls and the inner surface;
a first dielectric layer over the heat spreader and the semiconductor die, the first dielectric layer having a plurality of vias coupled to the plurality of die contact pads;
a second dielectric layer over the first dielectric layer and having a plurality of traces coupled to the plurality of vias; and
a solder resist layer over the second dielectric layer and having a plurality of package contact pads coupled to the plurality of traces, wherein the solder resist layer and the plurality of package contact pads form a generally planar top surface, wherein a first thickness of the solder resist layer is substantially similar to a second thickness of the plurality of package contact pads.

17. The semiconductor package of claim 16, wherein the first dielectric layer further comprises at least one trace coupled to one of the plurality of vias.

18. The semiconductor package of claim 16, wherein the second dielectric layer further comprises at least one via coupled to one of the plurality of traces.

19. The semiconductor package of claim 18, further comprising a third dielectric layer between the second dielectric layer and the solder resist layer such that an odd number of dielectric layers are between the semiconductor die and the plurality of package contact pads.

20. The semiconductor package of claim 16, wherein one of the plurality of package contact pads is coupled to at least two of the plurality of die contact pads.

* * * * *